(12) United States Patent
Fujita et al.

(10) Patent No.: US 8,063,468 B2
(45) Date of Patent: Nov. 22, 2011

(54) SEMICONDUCTOR DEVICE, METHOD FOR MANUFACTURING SEMICONDUCTOR DEVICE, AND METHOD FOR DESIGNING MANUFACTURING SEMICONDUCTOR DEVICE

(75) Inventors: Kazushi Fujita, Kawasaki (JP); Ryota Nanjo, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 217 days.

(21) Appl. No.: 12/207,922

(22) Filed: Sep. 10, 2008

(65) Prior Publication Data
US 2009/0079039 A1 Mar. 26, 2009

(30) Foreign Application Priority Data
Sep. 21, 2007 (JP) ................................ 2007-246195

(51) Int. Cl.
*H01L 23/00* (2006.01)
*H01L 21/762* (2006.01)
(52) U.S. Cl. ......... 257/620; 257/E23.002; 257/E21.545; 438/401

(58) Field of Classification Search .................. 257/620, 257/E23.002, E21.545; 438/401
See application file for complete search history.

(56) References Cited

U.S. PATENT DOCUMENTS
2005/0263855 A1* 12/2005 Fu et al. ......................... 257/620

FOREIGN PATENT DOCUMENTS
JP 60-083344 5/1985
JP 08-148490 6/1996
* cited by examiner

*Primary Examiner* — Victor A Mandala
(74) *Attorney, Agent, or Firm* — Staas & Halsey LLP

(57) ABSTRACT

A semiconductor device includes a semiconductor chip, a moisture resistant ring provided in the semiconductor chip and having a chamfered flat part in a position corresponding to a corner of the semiconductor chip, and a first monitor pattern formed inside the moisture resistant ring. At least a part of the first monitor pattern is disposed inside an n-sided polygonal area (n is a natural number which is 4 or higher than 4) situated within the moisture resistant ring, and outside a quadrangular area situated inside the n-sided polygonal area. The n-sided polygonal area has a vertex at least at each of a first end and a second end of the chamfered flat part, and the quadrangular area has a vertex at least at a middle point of the chamfered flat part.

6 Claims, 13 Drawing Sheets

SEMICONDUCTOR DEVICE, METHOD FOR MANUFACTURING SEMICONDUCTOR DEVICE, AND METHOD FOR DESIGNING MANUFACTURING SEMICONDUCTOR DEVICE

CROSS-REFERENCE TO RELATED APPLICATIONS

This application is based upon and claims the benefit of priority of the prior Japanese Patent Application No. 2007-246195, filed on Sep. 21, 2007, the entire contents of which are incorporated herein by reference.

BACKGROUND

1. Field

The embodiments discussed herein are directed to a semiconductor device having a pattern for length measurement together with a semiconductor element in the semiconductor chip area, a method for manufacturing the semiconductor device, and a method for designing the semiconductor device.

2. Description of the Related Art

The processing size of patterns has been reduced in recent years to meet the demand for smaller and more highly integrated semiconductor devices. A stable microfabrication technique is required for this reason. Pattern size measurement, that is, line width management, is extremely important in such microfabrication.

JP-A-8-148490 discusses a technique in which a line width management-specific pattern (monitor pattern) formed on the semiconductor substrate is observed with a length measurement SEM. The monitor pattern is observed to thereby estimate the line width of the pattern of the element of the semiconductor device formed on the semiconductor chip. Such a monitor pattern is formed in a location that does not hinder the chip formation on the semiconductor substrate.

A scribe line is used as a location of the monitor pattern formation area (line width management area). The scribe line is an area for separating the semiconductor chips on the semiconductor substrate.

If the line width management area is provided in the scribe line, it is necessary that the scribe line be wide, since two line width management areas are arranged in relation to the adjacent semiconductor chip. In this case, a problem arises in that the area of the scribe line is increased, decreasing the semiconductor chip area.

JP-A-60-83344 discusses a technique in which the line width management areas are disposed in the four corners in the semiconductor chip (semiconductor chip area) respectively instead of in the scribe line.

However, since the demand for smaller and more highly integrated semiconductor devices is growing, it is becoming difficult to secure the monitor pattern formation place. Therefore, by merely forming the line width management areas in the four corners in the semiconductor chip area, reliable line width management is difficult.

SUMMARY

According to an aspect of an embodiment, a semiconductor device includes a semiconductor chip, a moisture resistant ring provided in the semiconductor chip and having a chamfered flat part in a position corresponding to a corner of the semiconductor chip, and a first monitor pattern formed inside the moisture resistant ring, wherein at least a part of the first monitor pattern is disposed inside an n-sided polygonal area (n is a natural number which is 4 or higher than 4) situated within the moisture resistant ring, and outside a quadrangular area situated inside the n-sided polygonal area, the n-sided polygonal area has a vertex at least at each of a first end and a second end of the chamfered flat part, and the quadrangular area has a vertex at least at a middle point of the chamfered flat part.

According to an aspect of another embodiment, a semiconductor device includes a semiconductor element formed in a first area of a semiconductor chip, a frame surrounding the semiconductor element, and a first monitor pattern formed in an n-sided polygonal (n is a natural number which is 4 or higher than 4) second area disposed in a corner of the semiconductor chip and inside the frame.

According to an aspect of a further embodiment, a method for manufacturing a semiconductor device includes the operations of defining an n-sided polygonal (n is a natural number which is 4 or higher than 4) area in a corner of a semiconductor chip and inside a frame provided in the semiconductor chip, and forming a first pattern on the semiconductor chip and forming a second pattern in the n-sided polygonal area.

The above-described embodiments are intended as examples, and all embodiments are not limited to including the features described above.

DESCRIPTION OF EMBODIMENTS

Figure 1:
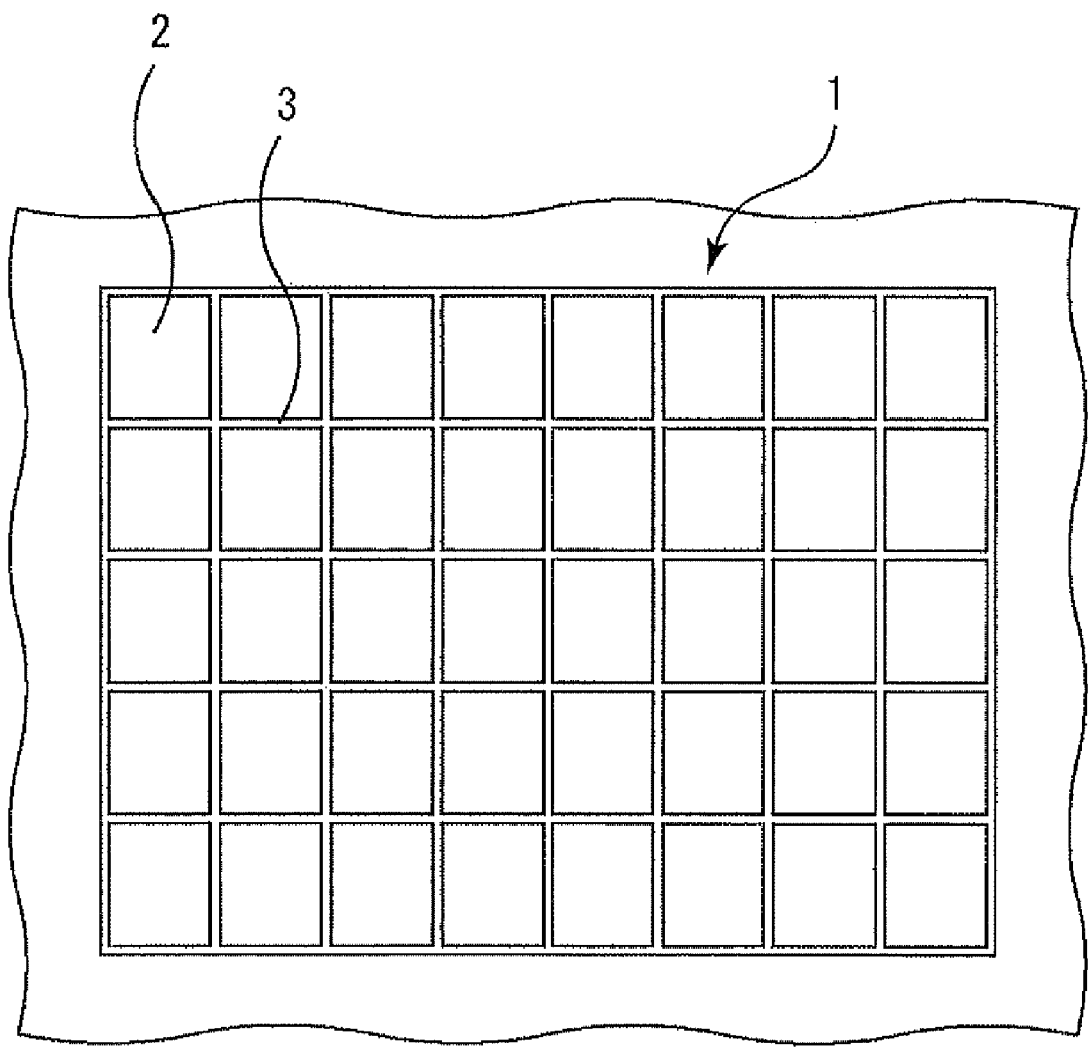
FIG. 1 is a schematic plan view showing a first comparative example of a first embodiment.

Reference may now be made in detail to embodiments, examples of which are illustrated in the accompanying drawings, wherein like reference numerals refer to like elements throughout.

First Embodiment

As shown in FIG. 1, a plurality (5×8 in this example) of identical semiconductor chips 2 are formed in matrix on a semiconductor substrate 1. The adjoining semiconductor chips 2 are separated by a scribe area 3. The center line of the scribe is referred to as a scribe center.

Figure 2:
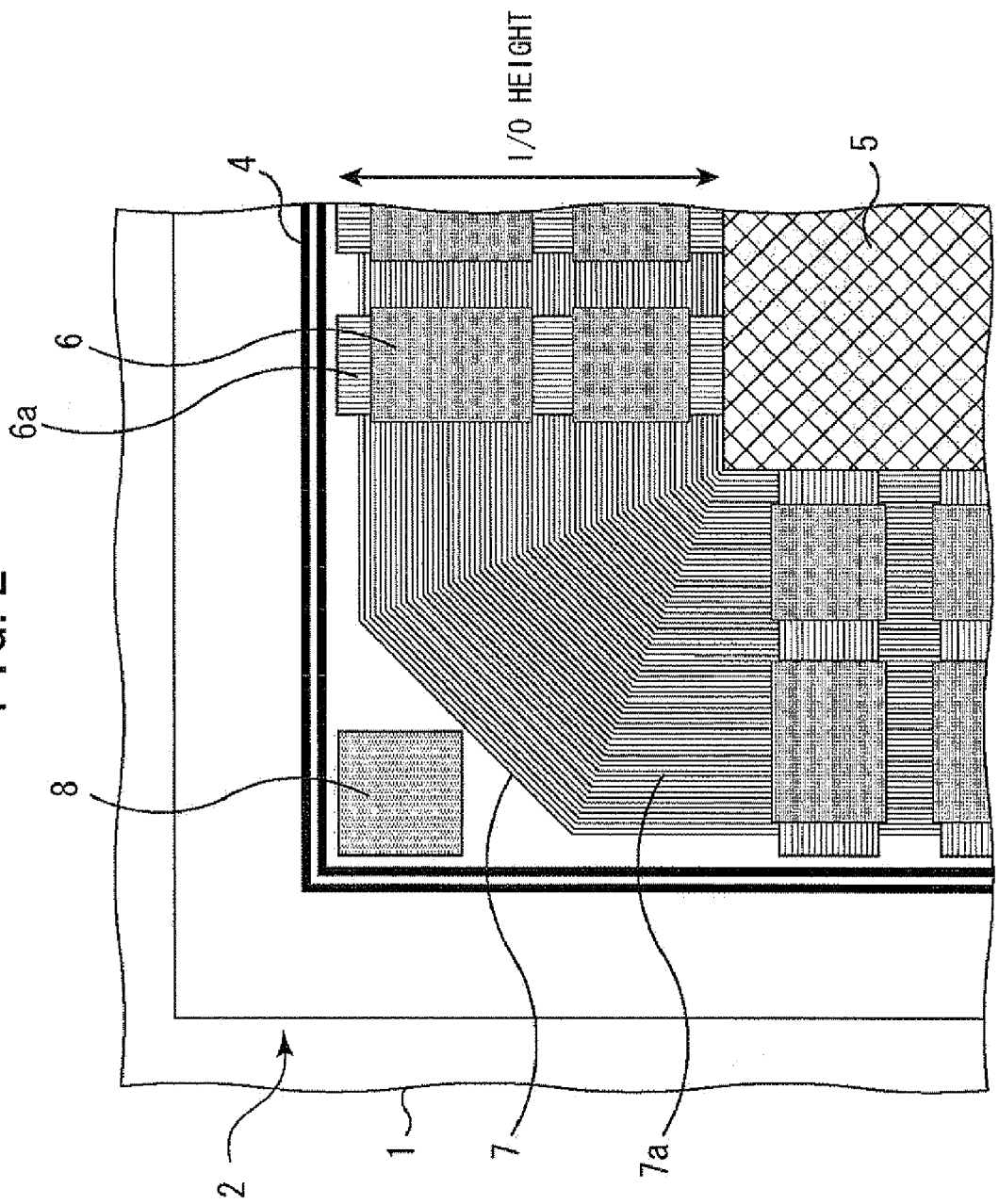
FIG. 2 is a schematic plan view showing a relevant part of FIG. 1.

As shown in FIG. 2, the semiconductor chips 2 are partitioned by a seal ring 4 which is a rectangular frame. The seal ring 4 prevents cracks from advancing into the chip. An element formation area 5, input and output (I/O) pads 6, and an I/O ring 7 are provided in the semiconductor chip area situated inside the seal ring 4.

Various semiconductor elements are formed in the element formation area 5. The I/O pads 6 are provided around the element formation area 5. The I/O pads 6 are electrically connected to the semiconductor elements and the like in the element formation area 5 by wirings 6a. The I/O ring 7 is formed of power lines 7a surrounding the element formation area 5, and electrically interconnects the I/O pads 6. The size of the area constituted by the I/O pads 6 and the I/O ring 7 is defined by the distance (I/O height) between an end of the element formation area 5 and an outer end of the wirings 6a.

An area (line width management area) 8 where monitor patterns corresponding to the semiconductor elements and the like in the element formation area 5 are formed is disposed in the four corners in the seal ring 4, that is, gaps formed between the seal ring 4 and the I/O ring 7. The line width management area 8 is quadrangular, in the first embodiment, or square as shown in the figure. FIG. 2 shows only the line width management area 8 in the upper left one of the four corners so as to be enlarged.

Figure 3:
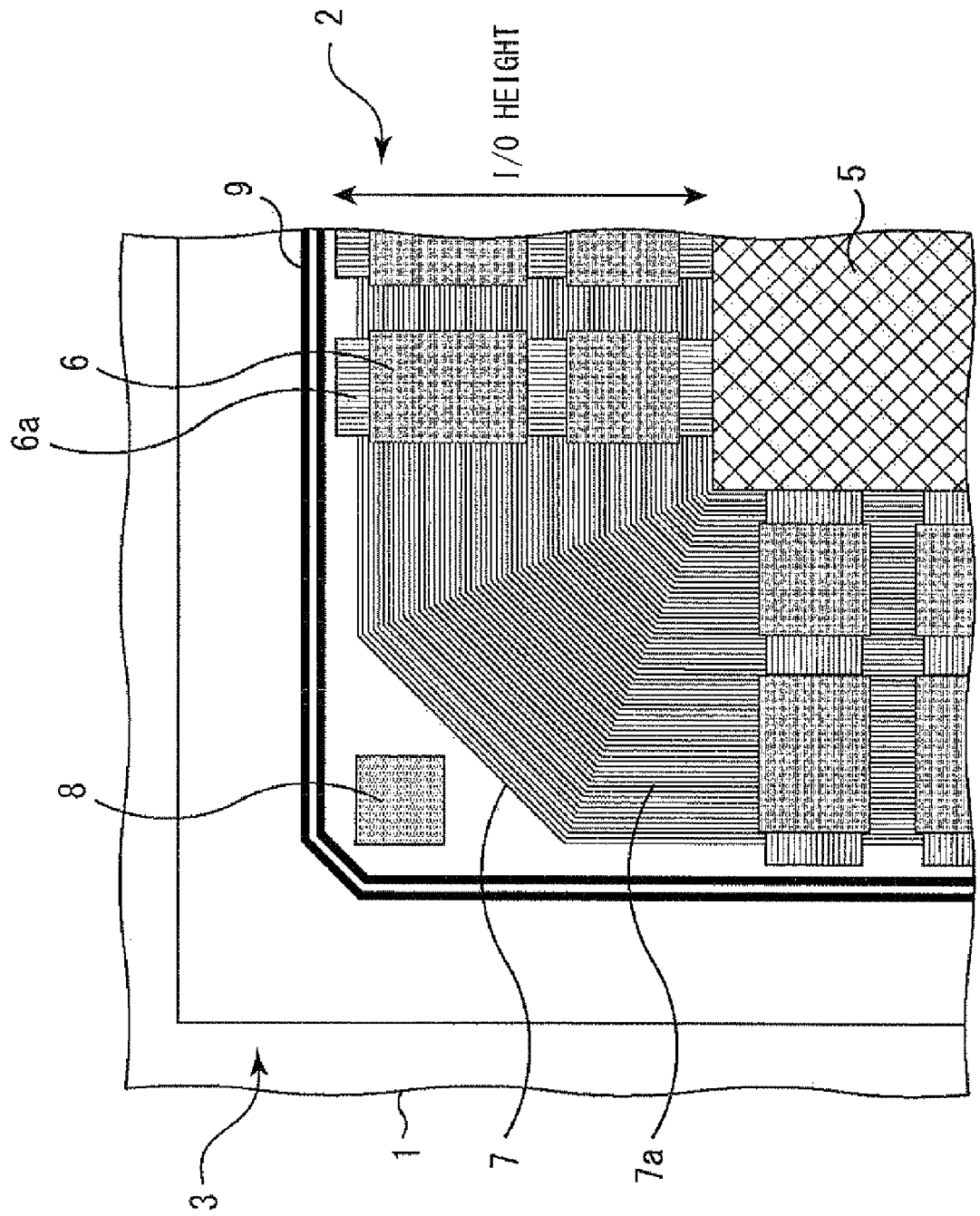
FIG. 3 is a schematic plan view showing one of the relevant parts in a second comparative example of the first embodiment.

In the semiconductor chip 2, as shown in FIG. 3, it is preferable to provide a seal ring 9 whose four angular parts are chamfered to prevent cracks from advancing into the semiconductor chip area. However, for example, if a square line width management area 11 is disposed as shown in the figure, the line width management area 11 is smaller than the line width management area 8 (shown in FIG. 2) because of the chamfering of the seal ring 9.

Figure 4:
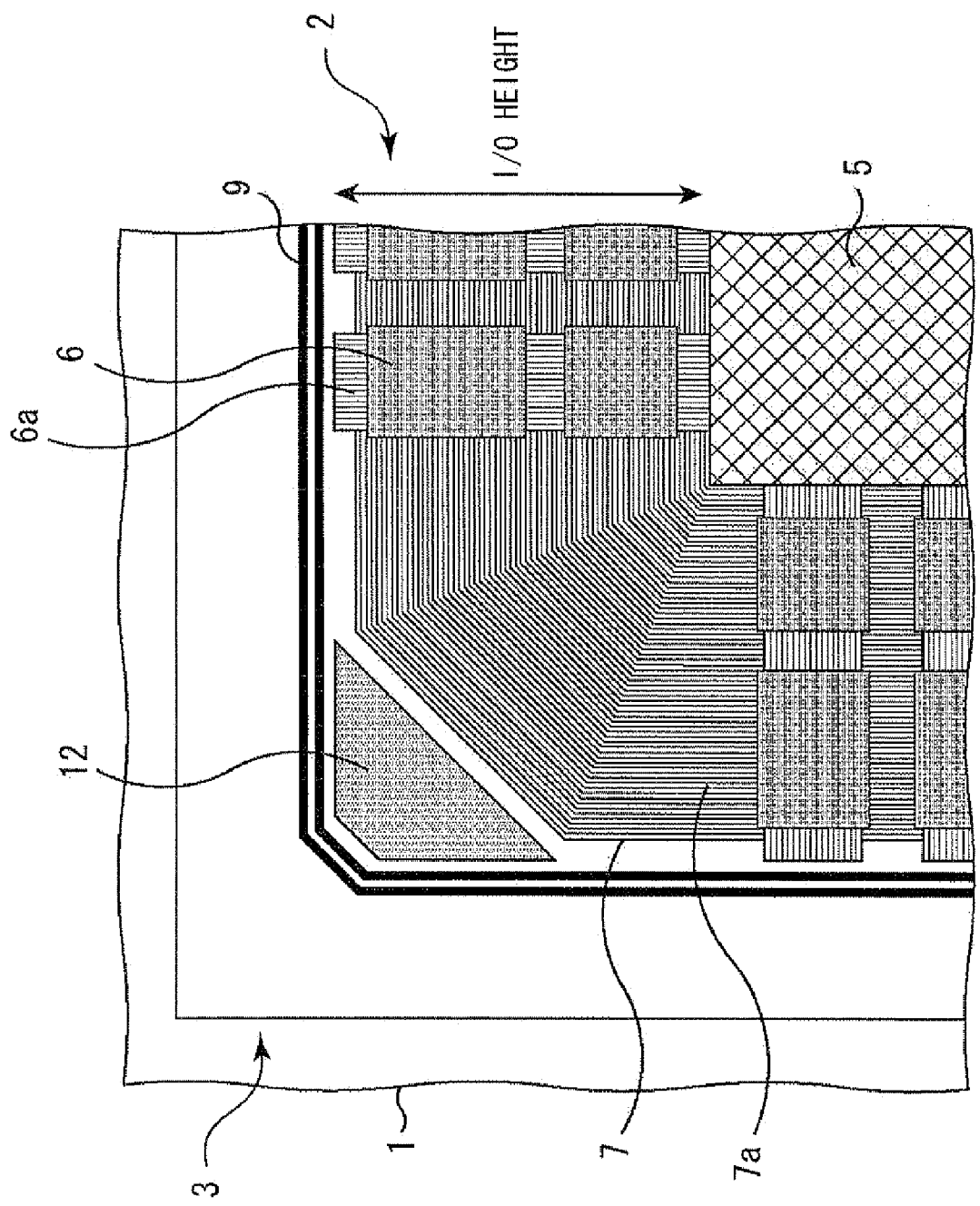
FIG. 4 is a schematic plan view showing one of the relevant parts in a third comparative example of the first embodiment.

Therefore, it is considered to provide a line width management area 12 that matches the size and shape of the gap formed between the seal ring 9 and the I/O ring 7 as shown in FIG. 4.

Figure 5:
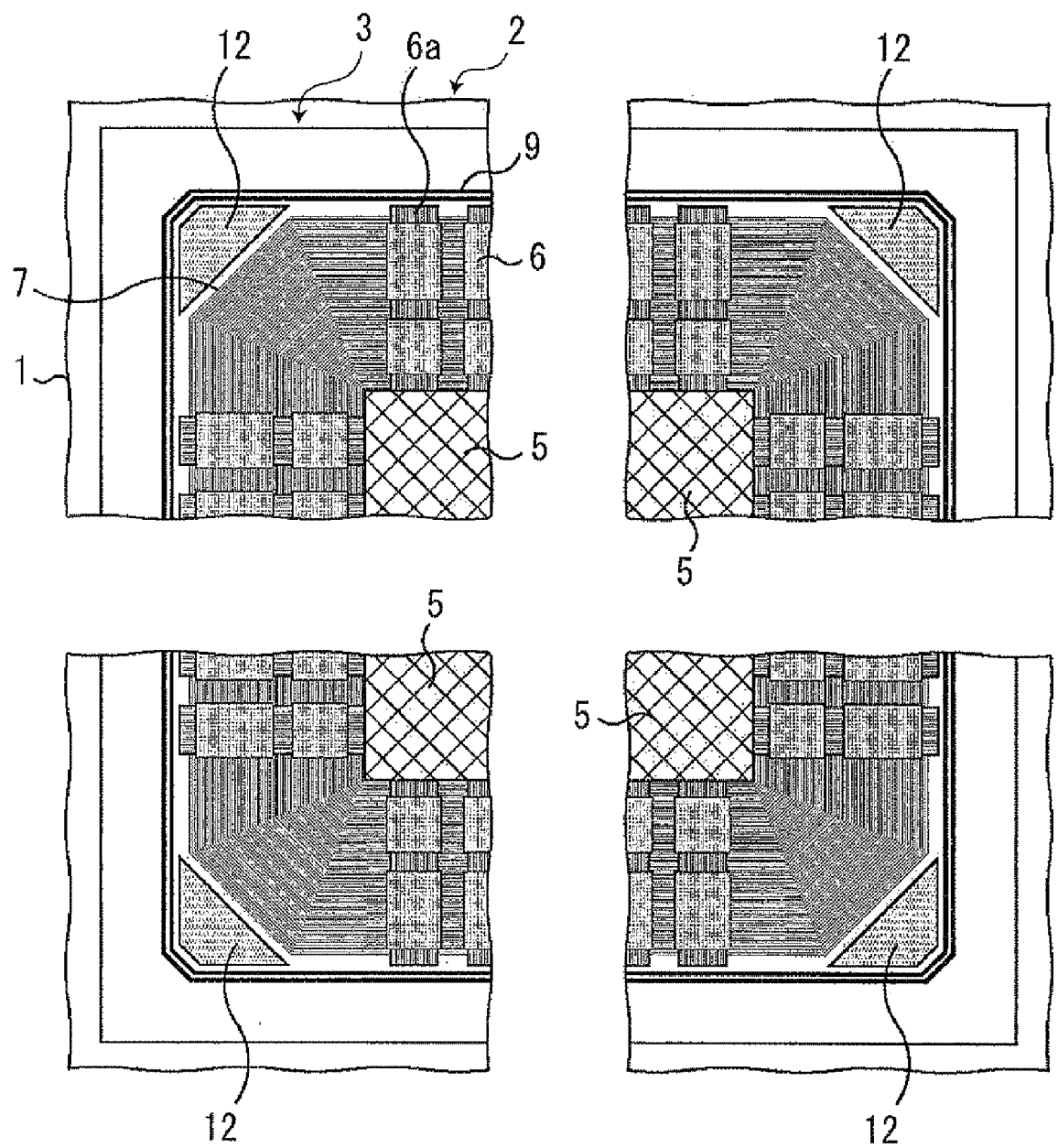
FIG. 5 is a schematic plan view for explaining a problem of the third comparative example of FIG. 4.

However, in this case, the following problem arises:

As shown in FIG. 5, the line width management areas 12 are disposed in the four corners in the semiconductor chip area surrounded by the seal ring 9. The shape of the line width management areas 12 matches the shape of the gaps formed between the seal ring 9 and the I/O ring 7. For this reason, the line width management areas 12 are disposed in different conditions rotated with respect to one another. The same various monitor patterns are formed in the line width management areas 12. Therefore, because of the areas 12 being rotated with respect to one another, the relative positions of the monitor patterns in the line width management areas 12 are different among the corners. In the line width management, the relative positions of the monitor patterns in the line width management area are preregistered, and the widths (or the diameters) of the monitor patterns are automatically measured based on the registered position data by, for example, a scanning electron microscope (SEM). Therefore, if the relative positions of the monitor patterns are different among the line width management areas 12 as described above, the efficiency of the measurement of the monitor patterns is decreased since the position registration is required for each line width management area 12.

The present inventor has arrived at the following embodiments to make the relative positions of the monitor patterns in the line width management areas the same, and to use the area of the line width management areas effectively.

Figure 6:
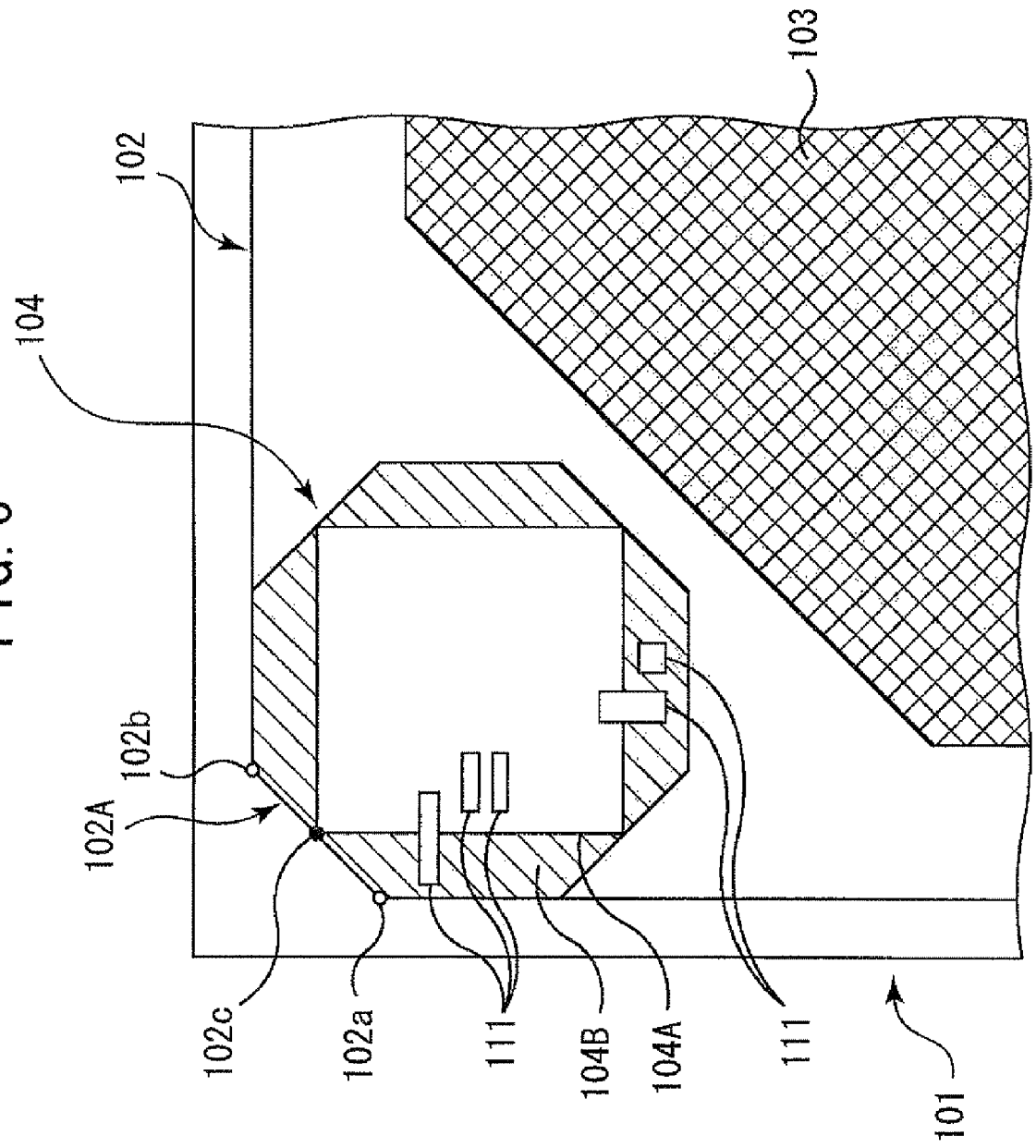
FIG. 6 is a schematic plan view for explaining the first embodiment.

In the first embodiment, the following are formed as shown in FIG. 6: a moisture resistant ring 102 having a chamfered flat part 102A at each angular part of a semiconductor chip 101; an element area 103 (part where the I/O ring and the element formation area are provided); and a plurality of monitor patterns 111 formed in an area between the moisture resistant ring 102 and the element area 103.

At least some of the monitor patterns 111 (in the illustrated example, two monitor patterns 111) are partly situated within an extended area 104B shown by the slanting lines in FIG. 6. That is, the extended area 104B exists inside a line width management area 104 which is an n-sided polygonal area (n is a natural number which is 4 or higher than 4) existing within the moisture resistant ring 102, and outside a quadrangular area 104A situated inside the line width management area 104. The line width management area 104, which is an n-sided polygonal area, has vertices at least at two chamfering base points 102a and 102b of the chamfered flat part 102A. The quadrangular area 104A has a vertex at least at the middle point 102c of the chamfered flat part 102A. In the first embodiment, an octagonal area is used as the n-sided polygonal area. The n-sided polygonal area is situated within the moisture resistant ring 102, and includes the quadrangular area 104A.

While the upper left part of the semiconductor chip is illustrated in FIG. 6, a monitor pattern of the same arrangement as that of the monitor pattern 111 is also formed in each of the other angular parts (the upper right part, the lower left part, and lower right part).

While some of the sides of the line width management area 104 coincide with the moisture resistant ring 102 in the above-described example, the actually defined line width management area 104 may be separated from the moisture resistant ring 102 by a predetermined distance.

In the present embodiment, even if the chamfered flat parts 102A are formed on the moisture resistant ring 102, not only the quadrangular area 104A but also the extended area 104B can be used as the area of formation of the monitor patterns 111. That is, the part within the line width management area 104 which is an octagonal area formed of the quadrangular area 104A and the extended area 104B is the area of formation of the monitor patterns 111. By forming the monitor patterns 111 in this manner, the area of the four corners of the semiconductor chip can be effectively used.

Hereinafter, the present embodiment will be described in further detail.

Figure 7:
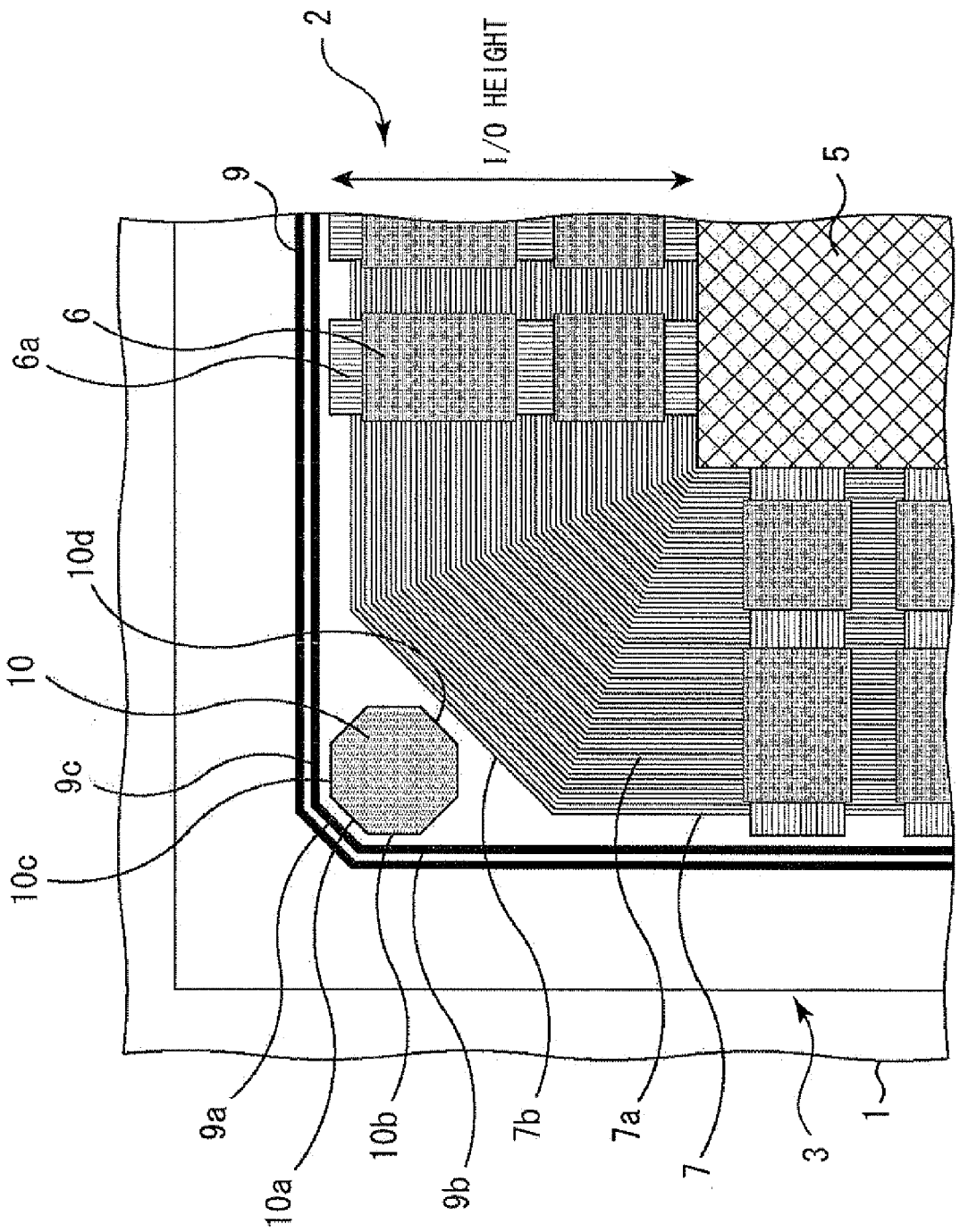
FIG. 7 is a schematic plan view showing one of the relevant parts in the first embodiment.
Figure 8:
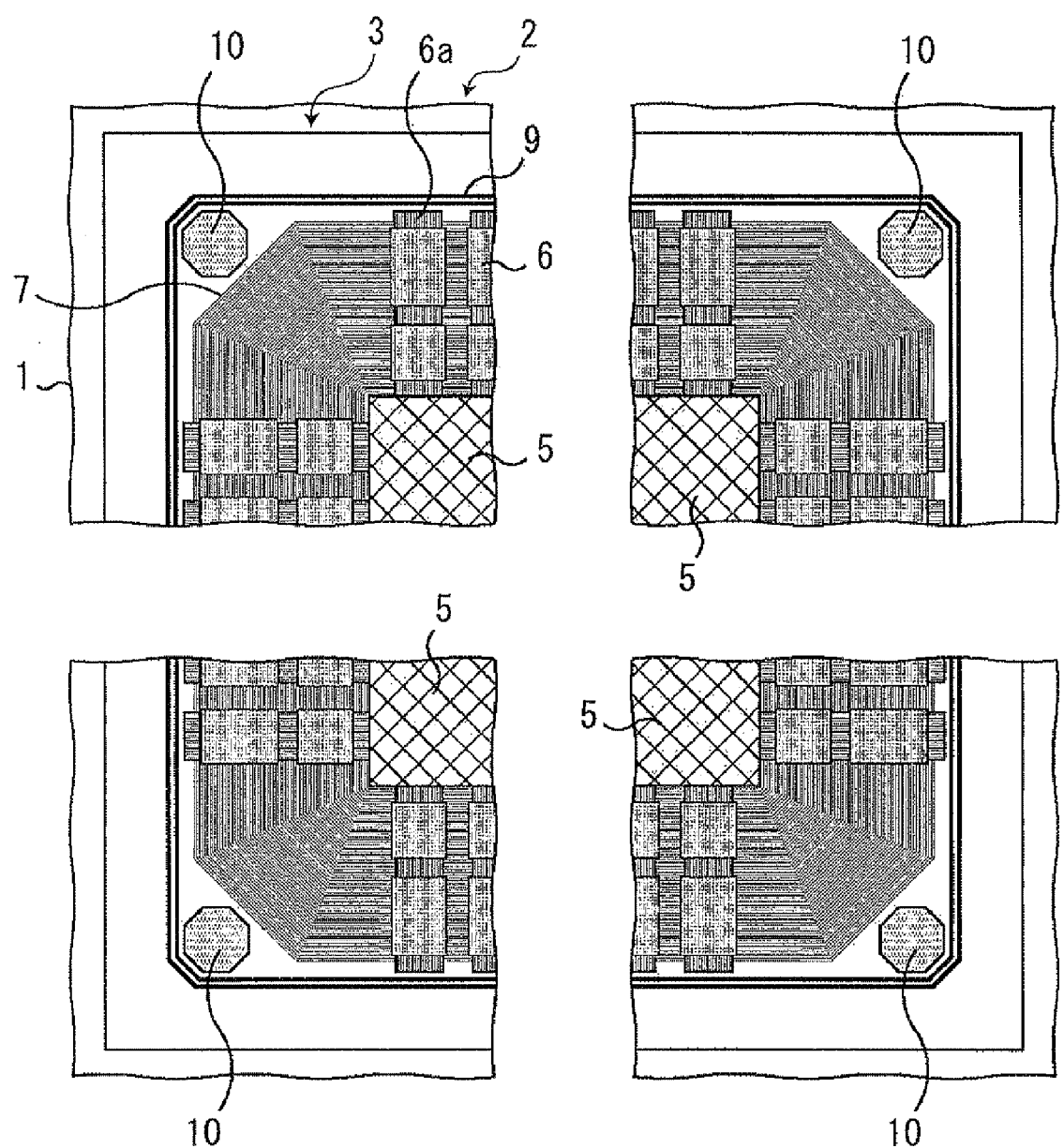
FIG. 8 is a schematic plan view showing the relevant parts in the first embodiment.

In the present embodiment, as shown in FIGS. 7 and 8, a line width management area 10 is formed in each of the four corners (the gaps formed between the seal ring 9 and the I/O ring 7) of the semiconductor chip area. The line width management area 10 is octagonal, in the present embodiment, regularly octagonal, and a plurality of sides adjacent to the chamfered seal ring 9 match with the seal ring 9. FIG. 7 shows only the line width management area 10 in the upper left one of the four corners so as to be enlarged.

The line width management area 10 has sides 10a, 10b, 10c, and 10d. As shown in FIG. 7, the side 10a of the line width management area 10 is defined so as to match with a side 9a of the chamfered part of the seal ring 9. The side 10a extends parallel to the side 9a. The sides 10b and 10c of the line width management area 10 are defined so as to match with two sides 9b and 9c connecting with the side 9a of the chamfered part of the seal ring 9, respectively. The sides 10b and 10c extend parallel to the sides 9b and 9c, respectively. The side 10d of the line width management area 10 is defined so as to match with a side 7b of the I/O ring 7. The side 10d extends parallel to the side 7b. Thus, the most is made of the area of the gaps between the seal ring 9 and the I/O ring 7. For example, the area ratio between the line width management area 10 of FIG. 7 and the line width management area 9 of FIG. 3 is 14:8.

Further, since the line width management areas 10 are rotationally symmetrical, their configurations are the same among the four corners in the semiconductor chip area. Consequently, the relative positions of the monitor patterns in the line width management areas 10 can be made the same among the four corners. This will be described specifically with reference to FIG. 9.

Figure 9:
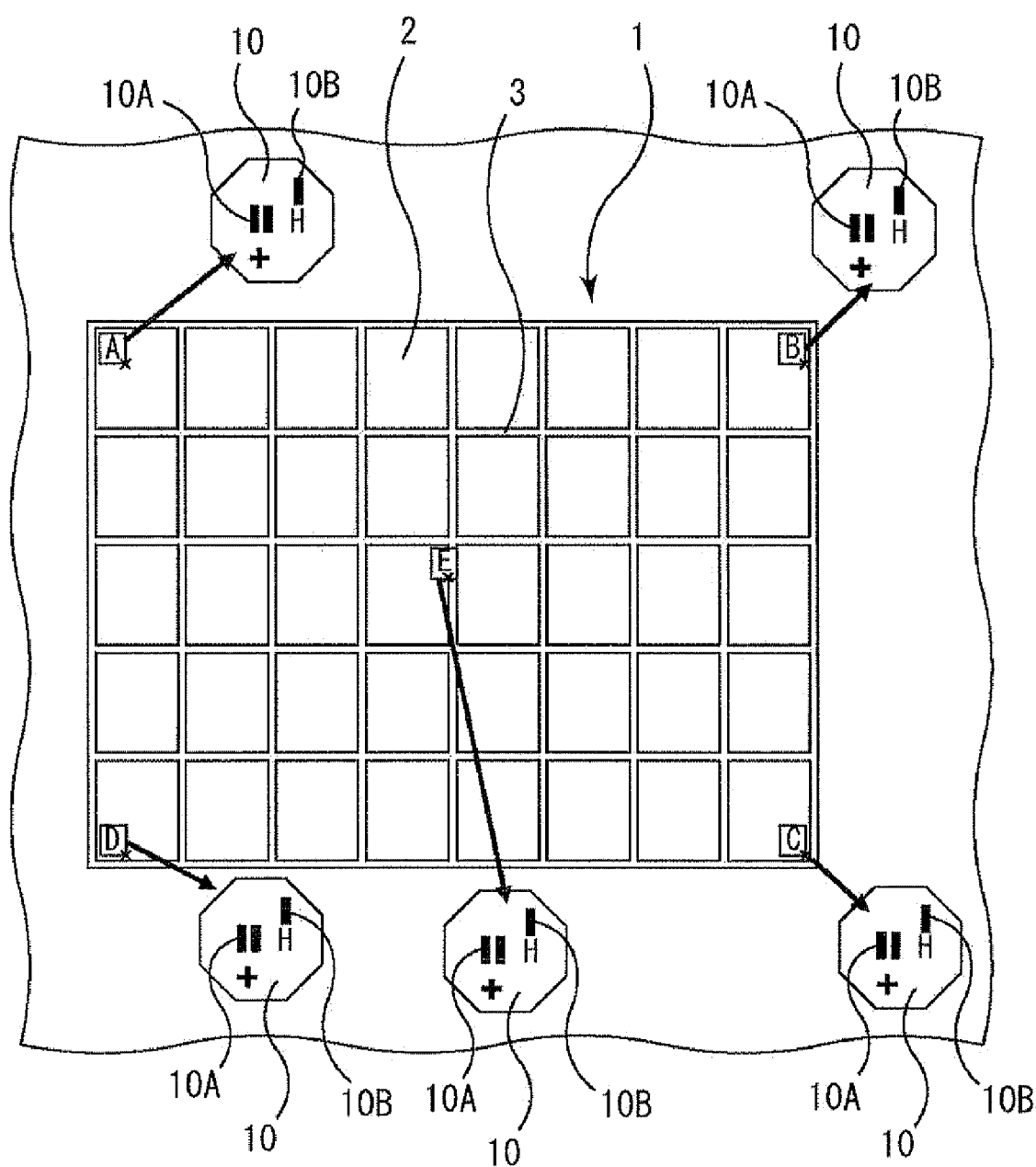
FIG. 9 is a schematic plan view for explaining the first embodiment.

In FIG. 9, a plurality of (5×8 in this example) same semiconductor chips 2 are disposed in matrix on the semiconductor substrate 1. These semiconductor chips 2 are demarcated by the scribe area 3. In the present embodiment, 5×8 chip patterns are formed on one mask, and 5×8 chip patterns are exposed on the semiconductor substrate by one exposure (one shot).

In the four corners, in the semiconductor chip area surrounded by the seal ring 9, of each semiconductor chip 2, the same line width management areas 10 are defined as described above.

If management as to how much line width variation is present is performed in the area formed by one shot, in the semiconductor chips 2 as shown in FIG. 9, it is necessary to automatically measure the lengths of the monitor patterns at least in the line width management areas 10 situated at the coordinates A to E corresponding to the four corners and the central part of the shot.

According to the length measurement recipe of the SEM for the line width management, the relative coordinates from a length measurement point to the next length measurement point are preregistered and the lengths are automatically measured.

Specifically, first, for example, the coordinates A of the line width management area 10 situated in the upper left part of the semiconductor chips 2 are inputted.

Then, moving to the + mark in the line width management area 10, the coordinates of a monitor pattern 10A are registered, and its length measurement parameter (a parameter representative of the kind of the monitor pattern such as a line pattern, a hole pattern, a positive type pattern and a negative type pattern) is registered.

Then, moving to the H mark, the coordinates of a monitor pattern 10B is registered and its length measurement parameter is registered in a similar manner.

Then, for example, the coordinates B of the line width management area 10 situated in the upper right part of the semiconductor chips 2 are inputted. In the present embodiment, since the relative positions of the monitor patterns 10A and 10B (and the + mark and the H mark) of this line width management area 10 are the same as those of the line width management area 10 at the coordinates A, the coordinates and length measurement parameters of the monitor patterns 10A and 10B registered for the coordinates A are simply copied. This applies to the line width management area 10C situated in the lower left part, the line width management area 10D situated in the lower right part, one of the line width management areas 12 at the line width coordinates A to D situated in the central part, and the management area 10E.

Figure 10:
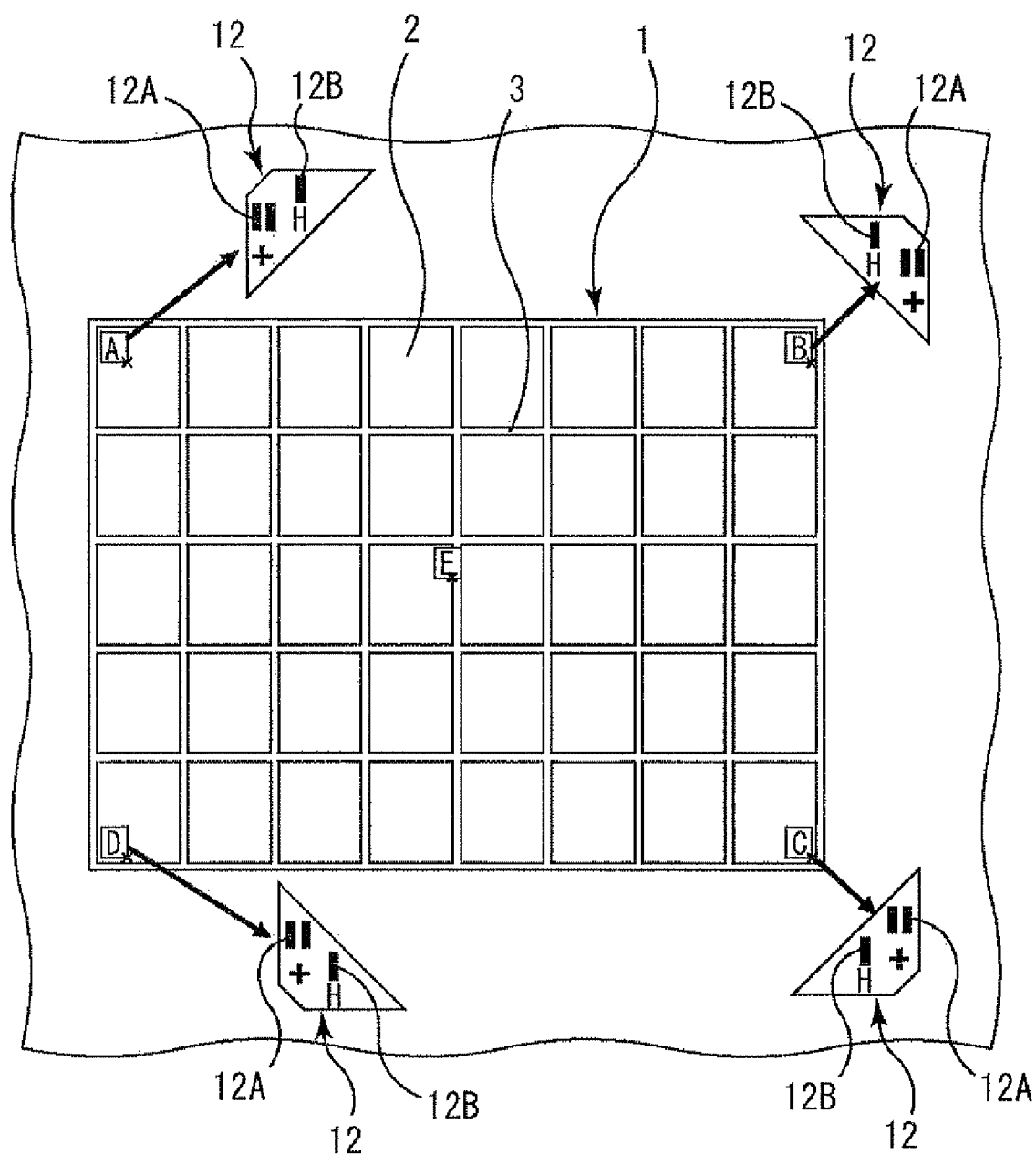
FIG. 10 is a schematic plan view for explaining a problem of a third comparative example of the first embodiment.

On the contrary, for example, in the line width management areas 12 of FIG. 4, the relative positions of the monitor patterns are different among the line width management areas 12 in the four corners of the semiconductor chips 2 as shown in FIG. 10. For this reason, it is necessary to register the coordinates of the monitor patterns 12A and 12B and their length measurement parameters for each of the line width management areas 12 at the coordinates A to D. The relative positions of the monitor patterns of the line width management area 12 in the central part are the same as those of one of the line width management areas 12 at the coordinates A to D.

As described above, according to the present embodiment, it is unnecessary to register the coordinates and length measurement parameters of the monitor patterns for each of a plurality of line width management areas. It is necessary to perform the registration only for one line width management area. Therefore, the line width management can be performed highly accurately and further, easily compared with the case as shown in FIG. 10.

As the shape of the line width management area, an octagon is most suitable. However, the shape of the line width management area is not specifically limited as long as the positions of a plurality of sides, adjacent to the seal ring, of the semiconductor chip area match with the seal ring as much as possible to secure a large area and the relative positions, in the line width management areas, of the monitor patterns disposed in the line width management areas are the same. For example, as the n-sided polygon (n is a natural number of 4 or more), various shapes such as a rhombus, a hexadecagon, a triacontadigon, a polygon with a larger number of sides (including a shape close to substantially circular and a circle), and a cross shape that can be accommodated in an octagon are applicable.

In this example, a case is described in which a plurality of semiconductor chips are formed by one shot and the line width variation in the shot is measured. However, the present embodiment is not limited to measuring the line width variation in the shot. The line width variation in each semiconductor chip can be managed by measuring the monitor patterns formed in the four corners of the semiconductor chip.

Further, the present embodiment is not limited to a case in which a plurality of semiconductor chips are formed by one shot. Even if one semiconductor chip is formed by one shot, the line width variation in the semiconductor chip can be managed by measuring the monitor patterns formed in the four corners of the semiconductor chip.

Further, if the variation in the shot is to be managed in a case where a plurality of semiconductor chips are formed by one shot, it is unnecessary to dispose the monitor patterns in the four corners of all the semiconductor chips. A structure may be adopted that monitor patterns in an octagonal area are formed at least in one of A to E shown in FIG. 9.

Second Embodiment

Semiconductor Device Design Method

First, a semiconductor device design method according to the present embodiment will be described.

Figure 11:
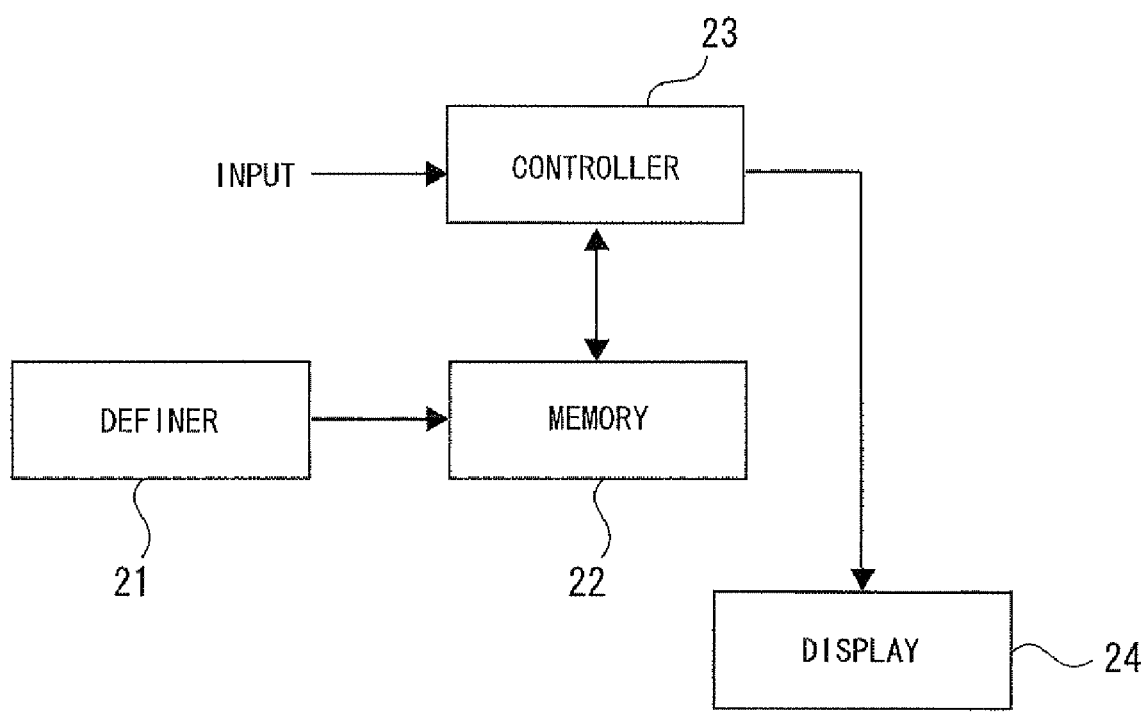
FIG. 11 is a block diagram showing an example of a method for designing a semiconductor device according to a second embodiment.

FIG. 11 is a block diagram showing an example of a semiconductor device design apparatus according to the present embodiment.

This design apparatus is provided with: a line width management area definer 21; a memory 22 that stores the coordinates of the line width management area defined by the definer 21; a controller 23 that receives various pieces of data and is for performing layout design to create the data of various patterns of the semiconductor device and the data of the monitor patterns corresponding thereto; and an image display 24 that displays the image of the layout design and the defined line width management area.

The definer 21 calculates the coordinates of each point of the regular octagon so that in the four corners in the semiconductor chip area (the gap formed between the seal ring 9 and the I/O ring 7), the area of the gap is made the most of in accordance with the shape, size and the like of the gap. Thereby, the line width management area is defined. The gap between the seal ring 9 and the I/O ring 7 is formed by the layout design by using the controller 23. Instead of providing the definer 21, the user may input appropriate coordinates and store them in the memory 22.

The controller 23 is formed of a CPU or the like, and performs the layout design based on the inputted various pieces of data by using a stream format such as the GDS-II format data of the Calma® Company.

Figure 12:
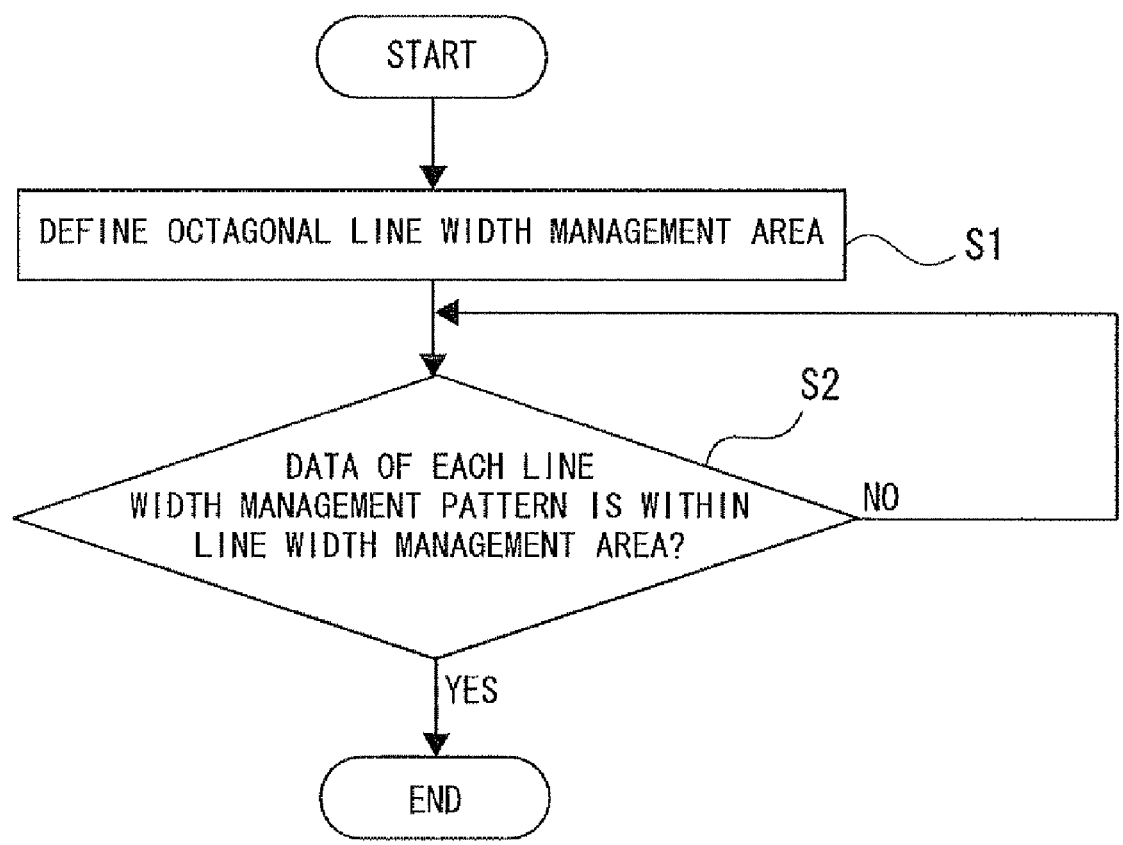
FIG. 12 is a flowchart showing a method for designing a semiconductor device according to the second embodiment.

FIG. 12 is a flowchart showing the semiconductor device design method according to the present embodiment.

In the present embodiment, first, for the gap of the four corners in the semiconductor chip area formed by the layout design by using the controller 23, the coordinates of each point of an appropriate regular octagon in the gap are calculated by the definer 21 or by the coordinate input by the user, thereby defining the line width management area (operation S1).

Then, the data of various patterns constituting various semiconductor devices of the semiconductor device is created, and the data of the (same) monitor patterns corresponding to the patterns is created one by one so as to be appropriately accommodated within the defined regularly octagonal line width management area and is arranged in the line width management area (operation S2). That is, the data of the (same) monitor patterns corresponding to the patterns is created one by one until it is appropriately accommodated within the defined line width management area, and is arranged within the line width management area.

Semiconductor Device Manufacturing Method

A semiconductor device manufacturing method to which the present embodiment is applied will be described.

Figure 13A:
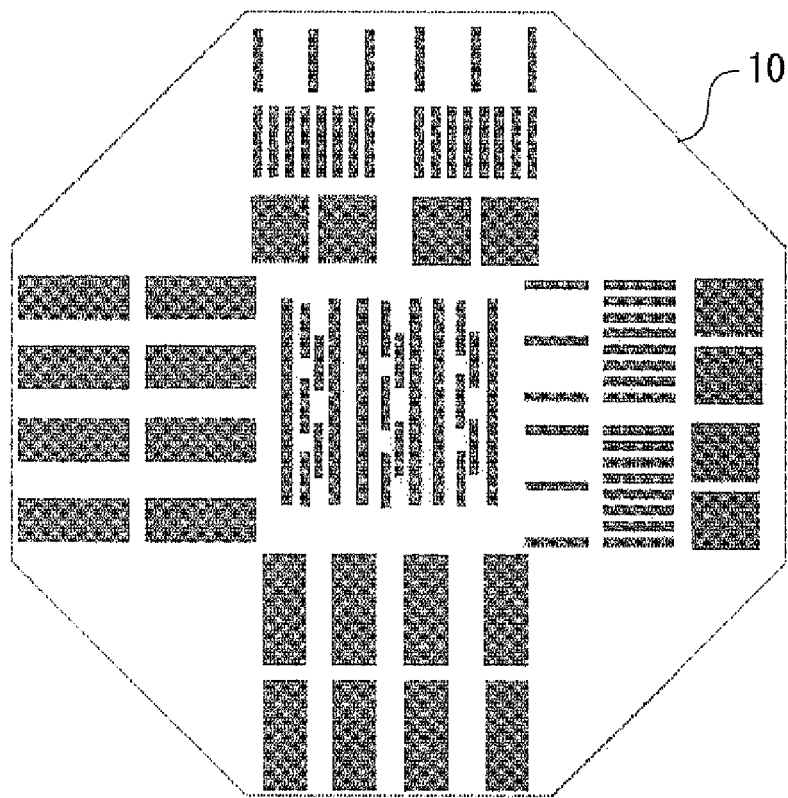
FIGS. 13A and 13B are schematic plan views showing a condition of a line width management area in a semiconductor device manufactured by the method for manufacturing semiconductor device according to the second embodiment.
Figure 13B:
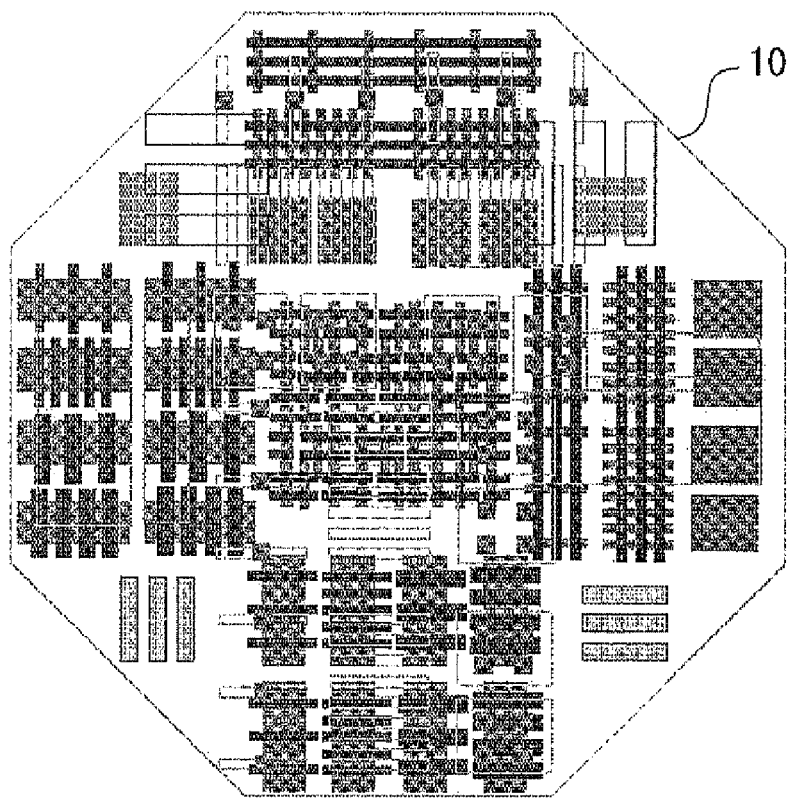

FIGS. 13A and 13B are schematic plan views showing a condition of the line width management area in the semiconductor device manufactured by the semiconductor device manufacturing method according to the present embodiment.

By using a photomask manufactured by using the above-described design method, for example, an element isolation area such as an STI (shallow trench isolation) element isolation structure according to the STI method is formed in the element formation area in the semiconductor chip area. Simultaneously therewith, as shown in FIG. 13A, various monitor patterns of the same shape and the same material are formed so as to correspond to the SIT element separation structures in the regularly octagonal line width management area 10 defined in the gap of the four corners in the semiconductor chip.

It is preferable that the above-described automatic length measurement using the SEM on the monitor patterns of the line width management areas 10 be performed for both of the resist patterns used to form the STI element isolation structures and the monitor patterns.

Then, for example, if the semiconductor device to be formed is a MOS transistor, the following of the semiconductor element are formed in the semiconductor formation area: a gate insulator film; a gate electrode; a source/drain region; a first interlayer insulator film covering this; contact holes formed in the first interlayer insulator film; first conductive plugs formed of the contact holes filled with a conductive material; first wirings connected to the first conductive plugs, respectively; a second interlayer insulator film; via holes; second conductive plugs; and second wirings.

In the present embodiment, with respect to the elements, among the above-mentioned elements of the MOS transistor, that require patterning such as the gate electrode, the contact holes and the wirings, various monitor patterns of the same shape and the same material corresponding to the elements, respectively, are formed one by one in the line width management area 10. FIG. 13B shows an example of monitor patterns corresponding to various elements in this way.

Likewise, it is preferable to perform the above-described automatic length measurement using the SEM on the monitor patterns of the line width management area 10, for both of the resist patterns used to form various elements and the monitor patterns.

As described above, according to the present embodiment, the area of the four corners of the semiconductor chip area can be made the most of and further, a line width management as easy and reliable as possible can be performed, so that a highly reliable semiconductor device can be realized.

Although a few embodiments have been shown and described, it would be appreciated by those skilled in the art that changes may be made in these embodiments without departing from the principles and spirit of the semiconductor and the method, the scope of which is defined in the claims and their equivalents.

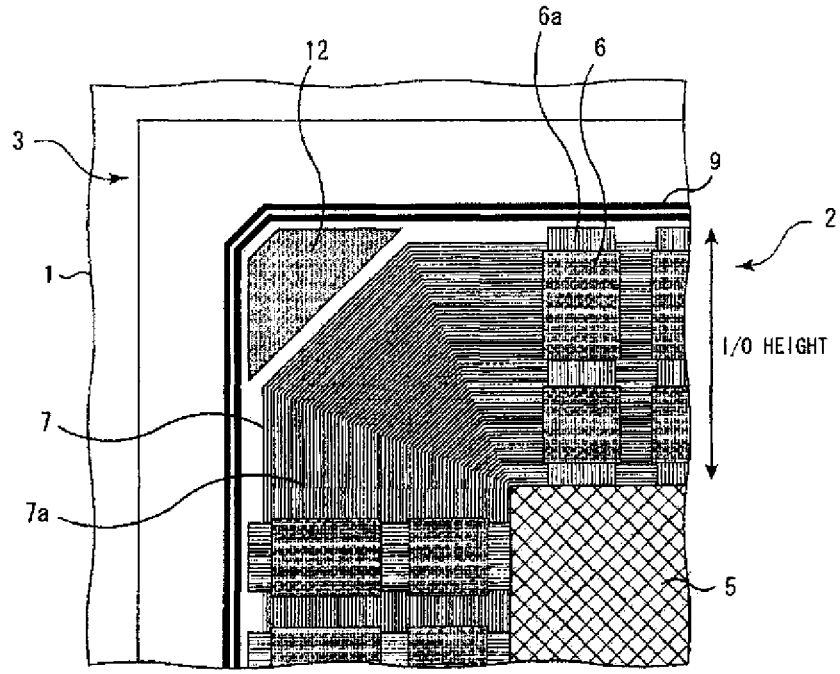

What is claimed is:

1. A semiconductor device comprising:
   a semiconductor chip;
   a moisture resistant ring provided in the semiconductor chip and having a chamfered flat part in a position corresponding to a corner of the semiconductor chip; and
   a first monitor pattern formed inside the moisture resistant ring,
   wherein at least a part of the first monitor pattern is disposed inside an n-sided polygonal area (n is a natural number which is 4 or higher than 4) situated within the moisture resistant ring, and outside a quadrangular area situated inside the n-sided polygonal area,
   the n-sided polygonal area has a vertex at least at each of a first end and a second end of the chamfered flat part, and
   the quadrangular area has a vertex at least at a middle point of the chamfered flat part.

2. The semiconductor device according to claim 1, further comprising a second monitor pattern, a third monitor pattern, and a fourth monitor pattern which have an arrangement same to an arrangement of the first monitor pattern,
   wherein the first monitor pattern, the second monitor pattern, the third monitor pattern, and the fourth monitor pattern are disposed in four corners of the semiconductor chip, respectively.

3. The semiconductor device according to claim 1,
   wherein the first monitor pattern is disposed outside an I/O ring of the semiconductor chip.

4. A semiconductor device comprising:
   a semiconductor element formed in a first area of a semiconductor chip;
   a frame surrounding the semiconductor element; and
   a first monitor pattern formed in an n-sided polygonal (n is a natural number which is 4 or higher than 4) second area disposed in a corner of the semiconductor chip and inside the frame,
   wherein the frame has a chamfered flat part at each of four corners of the frame, and one side of the n-sided polygonal second area is parallel to the chamfered flat part.

5. The semiconductor device according to claim 4, further comprising a second monitor pattern, a third monitor pattern, and a fourth monitor pattern which have relative positions same to a relative position of the first monitor pattern, wherein the first monitor pattern, the second monitor pattern, the third monitor pattern, and the fourth monitor pattern are disposed in four corners of the semiconductor chip, respectively.

6. The semiconductor device according to claim 5, wherein the frame is a seal ring.

* * * * *

UNITED STATES PATENT AND TRADEMARK OFFICE
CERTIFICATE OF CORRECTION

| | | |
|---|---|---|
| PATENT NO. | : 8,063,468 B2 | Page 1 of 1 |
| APPLICATION NO. | : 12/207922 | |
| DATED | : November 22, 2011 | |
| INVENTOR(S) | : Fujita et al. | |

It is certified that error appears in the above-identified patent and that said Letters Patent is hereby corrected as shown below:

Starting at column 10, line 3, insert:

--7. The semiconductor device according to claim 4,
   wherein the semiconductor element includes a element pattern formed on the semiconductor chip, and
   the first, second, third, and fourth monitor patterns are for length measurement and made of a material same a material of the element pattern.--

Signed and Sealed this
Sixth Day of March, 2012

David J. Kappos
*Director of the United States Patent and Trademark Office*

UNITED STATES PATENT AND TRADEMARK OFFICE
CERTIFICATE OF CORRECTION

PATENT NO. : 8,063,468 B2  
APPLICATION NO. : 12/207922  
DATED : November 22, 2011  
INVENTOR(S) : Fujita et al.

Page 1 of 2

It is certified that error appears in the above-identified patent and that said Letters Patent is hereby corrected as shown below:

Delete the title page and substitute therefor the attached title page showing the corrected number of claims in patent.

Starting at column 10, line 3, insert:

--7. The semiconductor device according to claim 4,
　　wherein the semiconductor element includes a element pattern formed on the semiconductor chip, and
　　the first, second, third, and fourth monitor patterns are for length measurement and made of a material same a material of the element pattern.--

This certificate supersedes the Certificate of Correction issued March 6, 2012.

Signed and Sealed this
Third Day of April, 2012

David J. Kappos
*Director of the United States Patent and Trademark Office*

CERTIFICATE OF CORRECTION (continued)

(12) United States Patent
Fujita et al.

(10) Patent No.: US 8,063,468 B2
(45) Date of Patent: Nov. 22, 2011

(54) SEMICONDUCTOR DEVICE, METHOD FOR MANUFACTURING SEMICONDUCTOR DEVICE, AND METHOD FOR DESIGNING MANUFACTURING SEMICONDUCTOR DEVICE

(75) Inventors: Kazushi Fujita, Kawasaki (JP); Ryota Nanjo, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 217 days.

(21) Appl. No.: 12/207,922

(22) Filed: Sep. 10, 2008

(65) Prior Publication Data
US 2009/0079039 A1 Mar. 26, 2009

(30) Foreign Application Priority Data
Sep. 21, 2007 (JP) ................. 2007-246195

(51) Int. Cl.
*H01L 23/00* (2006.01)
*H01L 21/762* (2006.01)
(52) U.S. Cl. ......... 257/620; 257/E23.002; 257/E21.545; 438/401
(58) Field of Classification Search ............ 257/620, 257/E23.002, E21.545; 438/401
See application file for complete search history.

(56) References Cited

U.S. PATENT DOCUMENTS
2005/0263855 A1* 12/2005 Fu et al. .................. 257/620

FOREIGN PATENT DOCUMENTS
JP 60-083344 5/1985
JP 08-148490 6/1996
* cited by examiner

*Primary Examiner* — Victor A Mandala
(74) *Attorney, Agent, or Firm* — Staas & Halsey LLP

(57) ABSTRACT

A semiconductor device includes a semiconductor chip, a moisture resistant ring provided in the semiconductor chip and having a chamfered flat part in a position corresponding to a corner of the semiconductor chip, and a first monitor pattern formed inside the moisture resistant ring. At least a part of the first monitor pattern is disposed inside an n-sided polygonal area (n is a natural number which is 4 or higher than 4) situated within the moisture resistant ring, and outside a quadrangular area situated inside the n-sided polygonal area. The n-sided polygonal area has a vertex at least at each of a first end and a second end of the chamfered flat part, and the quadrangular area has a vertex at least at a middle point of the chamfered flat part.

7 Claims, 13 Drawing Sheets